United States Patent
Bassom et al.

(10) Patent No.: US 8,049,192 B2
(45) Date of Patent: Nov. 1, 2011

(54) APPARATUS AND SYSTEM FOR CONTROLLING ION RIBBON BEAM UNIFORMITY IN AN ION IMPLANTER

(75) Inventors: Neil J. Bassom, Hamilton, MA (US); Leo V. Klos, Newburyport, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 194 days.

(21) Appl. No.: 12/647,152

(22) Filed: Dec. 24, 2009

(65) Prior Publication Data

US 2011/0155929 A1    Jun. 30, 2011

(51) Int. Cl.
*G21K 5/04* (2006.01)
*G21K 1/00* (2006.01)

(52) U.S. Cl. ........... 250/492.22; 250/492.23; 250/505.1; 250/251

(58) Field of Classification Search .................. 250/251, 250/396 R, 396 ML, 397, 398, 492.1, 492.2, 250/492.21, 492.22, 492.23, 493.3, 505.1
See application file for complete search history.

(56) References Cited

U.S. PATENT DOCUMENTS

| | | | |
|---|---|---|---|
| 5,350,926 A | | 9/1994 | White et al. |
| 5,811,823 A | * | 9/1998 | Blake et al. ............... 250/492.21 |
| 2003/0197132 A1 | * | 10/2003 | Keum et al. ............... 250/492.21 |
| 2004/0099818 A1 | * | 5/2004 | Jun et al. ................... 250/492.21 |
| 2005/0247889 A1 | * | 11/2005 | Yoon .......................... 250/491.1 |

* cited by examiner

*Primary Examiner* — Bernard E Souw (57) ABSTRACT

An ion beam blocking array configured to provide a mechanical means for adjusting the beam current profile of an ion ribbon beam by blocking the beam current at one or more locations across the ribbon beam. The ion beam blocking array includes a drive motor, an axle connected to the drive motor and a plurality of profile wheels disposed along the axle where each of the profile wheels is configured to rotate when the axle rotates. Each of the profile wheels is disposed across a width of the ribbon beam and has a position corresponding to a location along the width of the beam.

18 Claims, 5 Drawing Sheets

APPARATUS AND SYSTEM FOR CONTROLLING ION RIBBON BEAM UNIFORMITY IN AN ION IMPLANTER

BACKGROUND OF THE INVENTION

1. Field of the Invention

Embodiments of the invention relate to the field of semiconductor device fabrication. More particularly, the present invention relates to a system for controlling ribbon beam uniformity in an ion implanter by adjusting the beam current profile along the beam path.

2. Discussion of Related Art

Ion implantation is a process used to dope impurity ions into a semiconductor substrate to obtain desired device characteristics. An ion-beam is directed from an ion source chamber toward a substrate. The depth of implantation into the substrate is based on the ion implant energy and the mass of the ions generated in the source chamber. One or more ion species may be implanted at different energy and dose levels to obtain desired device structures.

Figure 1:
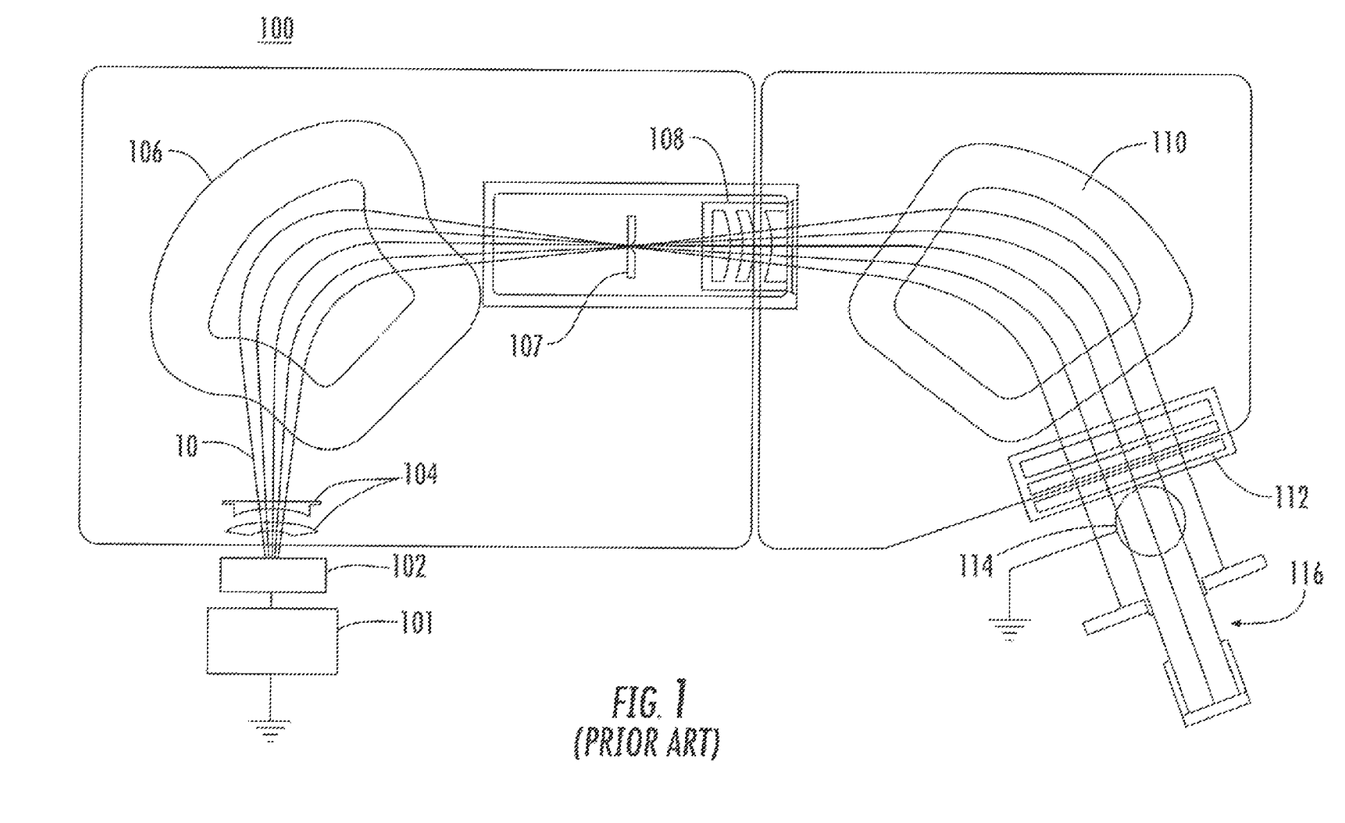
FIG. 1 illustrates a block diagram of a representative ion implanter.

FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 and formed into a beam 10 which passes through a mass analyzer magnet 106. The mass analyzer is configured with a particular magnetic field such that only the ions with a desired mass-to-charge ratio are able to travel through the analyzer for maximum transmission through the mass resolving slit 107.

Ions of the desired species pass from mass slit 107 through a deceleration stage 108 comprising multiple electrodes with defined apertures that allow the ion beam to pass through. By applying different combinations of voltage potentials to the multiple electrodes, the deceleration stage 108 manipulates the ion energies. A corrector magnet 110 shapes or collimates the ion beam generated from the deceleration stage 108 into the correct form for deposition onto a wafer or substrate. In particular, the corrector magnet receives a divergent ion beam and collimates the beam. Corrector magnet 110 is energized to deflect ion beamlets in accordance with the strength and direction of the applied magnetic field to provide a ribbon beam targeted toward a work piece or substrate positioned on support (e.g. platen) 114. In addition, the corrector magnet 110 filters out any ions from the beam that may have been neutralized while traveling through the beamline. In some embodiments, a second deceleration stage 112 may be disposed between corrector magnet 110 and support 114. The ions lose energy when they collide with electrons and nuclei in the substrate and come to rest at a desired depth within the substrate based on the acceleration energy.

Generally, beam current, energy contamination and beam uniformity (current density and angle of implantation) are the parameters that jeopardize device throughput during semiconductor manufacturing processes. For example, if the beam current is too low, this will reduce the throughput of the implanter for a given total ion dose. Energy contamination occurs when there is a small fraction of the ion beam that is at a higher energy than desired which rapidly increases the depth of the desired junction that is formed in the substrate when creating an integrated circuit. This leads to degraded performance of the desired circuit profile.

Beam uniformity is determined, in part, by the profile of the ion beam used for ion implantation. The beam profile is a map of ion beam intensity in a plane orthogonal to the direction of beam transport. The beam current may vary over the cross-sectional area of the ion beam, particularly in the case of large area beams such as ribbon ion beams. Furthermore, the beam profile may vary with implant conditions, such as dopant species, energy and current, and with time. These variations can compromise the desired device characteristics which produce lower manufacturing yields and lead to higher processing costs. Accordingly, it is desirable to measure and, if necessary, adjust the beam profile in order to enhance ion implanter performance before the ribbon beam is incident on the surface of a wafer or substrate.

SUMMARY OF THE INVENTION

Exemplary embodiments of the present invention are directed to a system for adjusting ion ribbon beam profiles in an ion implanter. In an exemplary embodiment, a beam blocking array is positioned across a path of an ion ribbon beam in an ion implanter. The ion ribbon beam having a corresponding beam profile. The beam blocking array including a drive motor, an axle connected to the drive motor and a plurality of profile wheels disposed along the axle where each of said profile wheels is configured to rotate when the axle rotates. In addition, the array is disposed across a width of the ribbon beam such that each of the profile wheels has a position corresponding to a location across the ion beam.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2A:
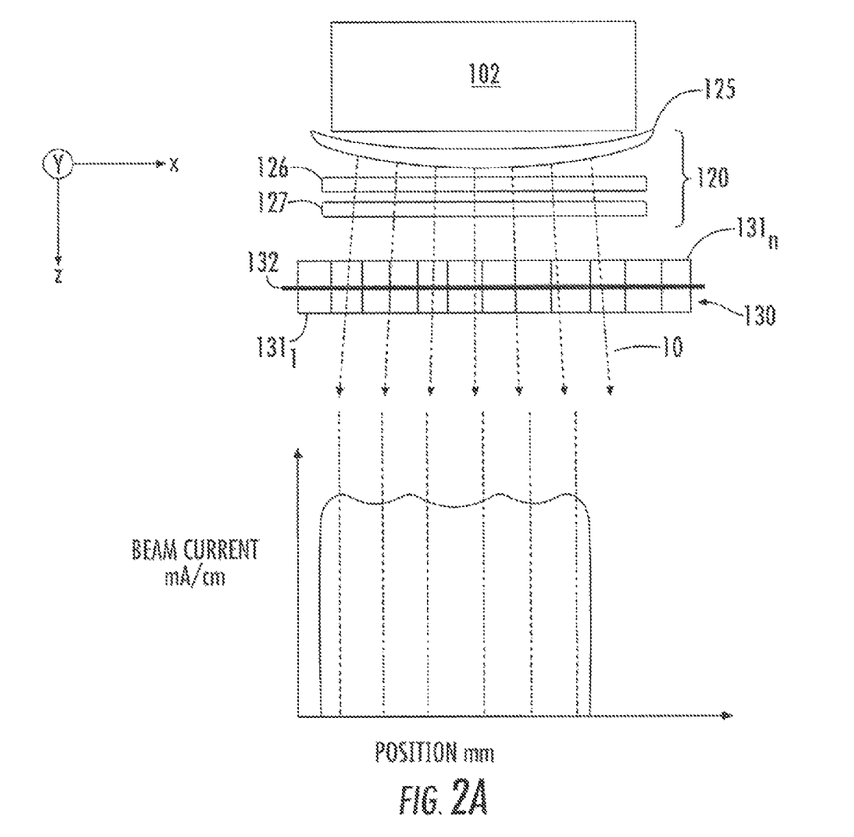
FIGS. 2A, 2B illustrate the location of a beam blocking array in an ion implanter in accordance with an embodiment of the present disclosure.

FIG. 2A is a top block diagram view of a portion of an ion implanter 100 including an ion source chamber 102, extraction electrode assembly 120 and beam blocking array 130. Different feed gases are supplied to the source chamber 102 to generate ions having particular dopant characteristics. The ions are extracted from source chamber 102 via a standard three (3) electrode, extraction assembly 120 comprising a plasma or arc slit electrode 125, suppression electrode 126 downstream from plasma electrode 125 and ground electrode 127 downstream from suppression electrode 126. These electrodes are used to create a desired electric field to focus ion beam 10 extracted from source chamber 102.

Plasma electrode 125 may be biased at the same large potential as the source chamber 102. Plasma electrode 125 includes a slot through which ions extracted from ion source chamber 102 pass. The slot has a width in the X direction that is significantly greater than its height in the Y direction to provide a high aspect ratio to form a ribbon ion beam traveling in the Z direction. Similarly, suppression electrode 126 includes a slot which is aligned with the slot from the plasma electrode which also has a width (X direction) significantly greater than its height (Y direction). Suppression electrode 126 is connected to a power supply and is typically biased at a moderate negative value to prevent electrons from entering back into source chamber 102 and to assist in focusing ion beam 10. Ground electrode 127 is positioned downstream from suppression electrode 126 and is maintained at ground potential. Ground electrode 127 also includes a slot aligned with the slot of the plasma electrode 125 and the slot of the suppression electrode 126 which also has a width significantly greater than its height. The strength of the electric field generated by the electrodes can be tuned to a desired beam current to extract a particular type of ion ribbon beam 10 from ion source chamber 102.

Figure 2B:
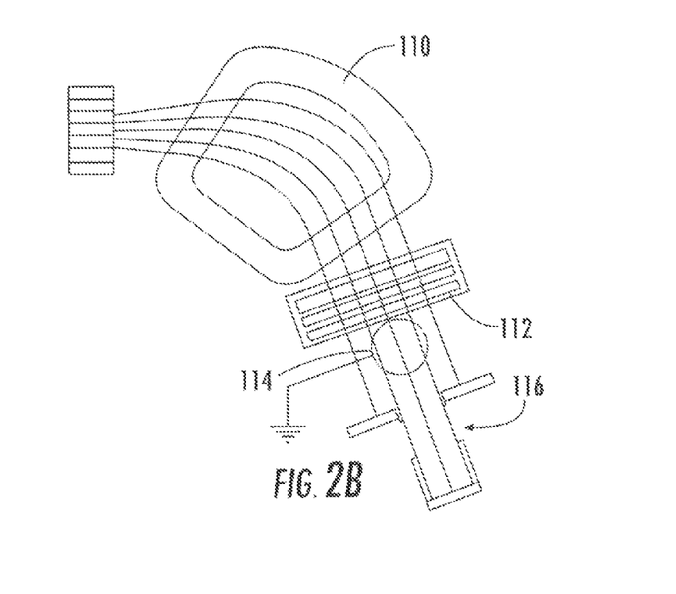

Beam blocking array 130 may be disposed downstream of extraction electrode assembly 120 as illustrated in FIG. 2A or may be disposed upstream from corrector or collimator magnet 110 of ion implanter 100 as illustrated in FIG. 2B, or may be located just upstream from platen 114. Beam blocking array 130 is positioned across the width of beam 10 in the X direction and comprises a plurality of profile wheels $131_1 \ldots 131_N$. Each profile wheel $131_1 \ldots 131_N$ is a non-circular, shaped element mounted on a centrally disposed stationary axle 132. Blocking array 130 may be fabricated from graphite or similar suitable conducting material. Generally, beam blocking array is configured to mechanically block, to varying degrees, selected portions of ribbon beam 10 extracted from ion source chamber 102 across the width of the beam to provide a desired uniform beam profile as illustrated in the exemplary profile of beam current vs. position included in FIG. 2A.

Prior attempts to mechanically block portions of a ribbon beam employed a plurality of drive systems to individually position each of the profile wheels. However, this arrangement required a full set of drive motors for each profile wheel and associated complex sealing arrangements between the air-vacuum interface from the drive mechanics to the vacuum environment of the implanter and the ribbon beam. This resulted in vacuum leaks and consequently poor reliability. Alternatively, vacuum-compatible drive motors such as, for example, piezo-electric actuators may be employed which only require electric connections across the air-vacuum interface. However, even with such piezo-electric actuators there remains a requirement to have as many drive systems as beam profile wheels which increases cost and complexity which may compromise reliability.

As described below, the beam blocking array 130 of the present disclosure utilizes a single drive assembly and position feedback system to arrange the plurality of profile wheels $131_1 \ldots 131_N$ to mechanically block portions of ribbon beam 10 to varying degrees across the width of the beam. If the blocking array 130 is disposed upstream of the collimator magnet 110 as shown in FIG. 2B, the array acts upon the full width of the beam 10 and the number and width of each of the profile wheels will be greater than the number and width of the profile wheels of array 130 disposed downstream of extraction electrode assembly 120 shown in FIG. 2A. For example, array 130 shown in FIG. 2A with respect to the extraction electrode assembly 120 may be approximately 90 mm wide comprising twelve (12) separate profile wheels each having a width of about 7.5 mm. Alternatively, array 130 shown in FIG. 2B with respect to collimator magnet 110 may be approximately 500 mm wide comprising twenty (20) separate profile wheels each having a width of about 25 mm. Of course, these values are only provided as an example and may vary depending on the base uniformity profile to be corrected. In addition, the number of profile wheels or elements utilized will correspond to the minimum length scale in the desired profile and the degree of uniformity desired.

Figure 3:
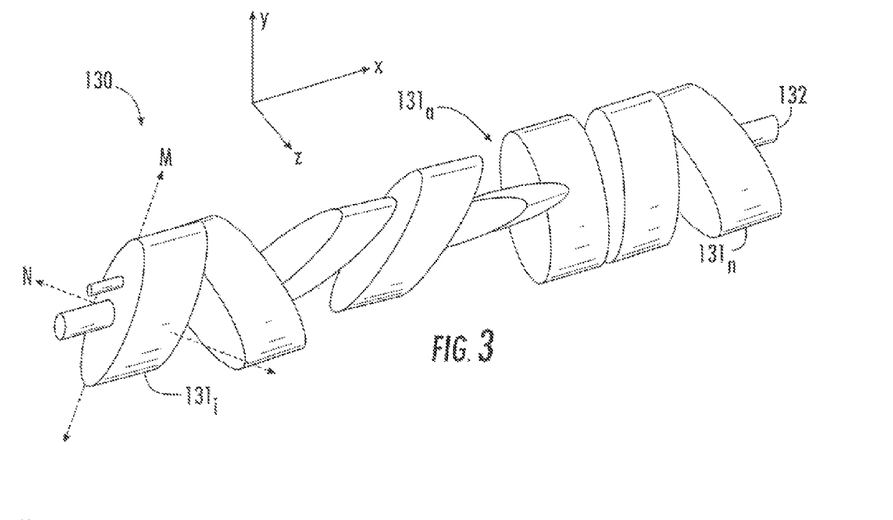
FIG. 3 is a perspective view of beam blocking array having a plurality of profile wheels in accordance with an embodiment of the present disclosure.

FIG. 3 is a perspective view of beam blocking array 130 having a plurality of profile wheels $131_1 \ldots 131_N$ rotatably disposed about axis 132. Each profile wheel has an elliptical shape and is ideally in contact with an adjacent profile wheel. The profile wheels may be prevented from lateral movement in direction X by the use of washers and/or C clamps. Blocking array 130 is located below (in direction Y) ribbon beam 10 such that the upper portions 131A of each of the profile wheels extends into the lower part of the beam 10 traveling above array 130 in direction Z. Alternatively, one end of each profile wheel for example, 131A can be used for blocking beams of p type dopants and the opposite end of each profile wheel can be used to block beams of n type dopants.

Each profile wheel $131_1 \ldots 131_N$ has a major axis M along the longitudinal length of the profile wheel and a minor axis N along the width of the profile wheel transverse to the major axis M. As each profile wheel $131_1 \ldots 131_N$ rotates about axis 132, the amount or degree that the respective element blocks a portion of the ribbon beam 10 varies depending on what portion of the wheel along its respective major axis M blocks the beam. For example, as profile wheel $131_1$ is rotated such that its major axis M is parallel to the beam line of beam 10 traveling in direction Z, then the portion 131A of the profile wheel $131_1$ is below the beam and will not block the corresponding beam location. If profile wheel $131_1$ is rotated such that its major axis M is 90° to the beam line of beam 10, then the portion 131A of the profile wheel $131_1$ will block a portion of the beam corresponding to the position of profile wheel $131_1$ across the width of the beam 10.

Figure 4:
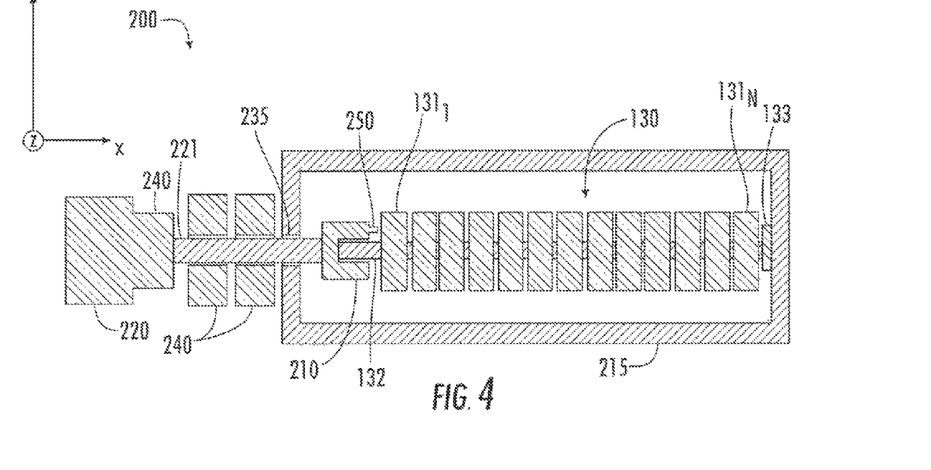
FIG. 4 illustrates a beam blocking array assembly in accordance with the present disclosure.

FIG. 4 illustrates a beam blocking array assembly 200 in accordance with the present disclosure including beam blocking array 130, drive wheel 210 disposed within housing 215 and drive motor 220 disposed outside of housing 215. Ball race 240 is disposed between drive motor 220 and housing 215. Axle 132 is supported by drive wheel 210 and to the housing 215 at 133 about which each of the profile wheels rotate. In other words, each of the profile wheels $131_1 \ldots 131_N$ rotate about a stationary axle 132. The drive motor 220 rotates drive wheel 210 via drive shaft 221 and is located on the atmosphere side of the vacuum environment of the implanter along with encoder 240. The rotary motion from the drive motor 220 on the atmosphere side is transferred to the drive wheel 210 via drive shaft 221 on the vacuum side via a ferrofluid seal 235. When the drive wheel 210 rotates, a drive pin 250 engages profile wheel $131_1$ upon rotation. In particular, when the drive wheel 210 is rotated in one direction (either clockwise or counterclockwise), the drive pin 250 engages a first profile wheel $131_1$. Each of the profile wheels $131_1 \ldots 131_N$ also includes a drive pin 258 which protrudes from the respective profile wheels parallel to axle 132 in direction X away from drive motor 220 as well as a pick-up pin 268 which extends parallel to axle 132 in direction X toward drive motor 220.

Figure 5:
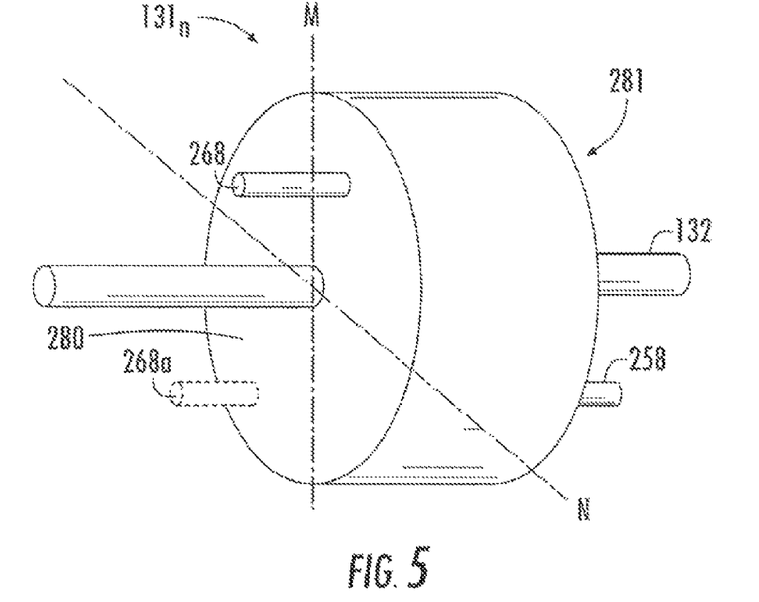
FIG. 5 is a perspective view of an exemplary profile wheel in accordance with the present disclosure.

This can be more easily seen turning briefly to FIG. 5 which is a perspective view of an exemplary profile wheel $131_N$ having a pair of opposed sides 280 and 281. The profile wheel has an elliptical shape (although other configurations may be utilized) with major M and minor N axes. Axle 132 is centrally disposed through profile wheel $131_N$. Drive pin 258 extends away from drive motor 220 from surface 281 and pick-up pin 268 extends toward drive motor 220 from surface 280. The pick-up pin 268 and drive pin 258 are spaced the same distance from axle 132 on respective surfaces 280 and 281. An additional pick-up pin 268A shown in shadow may also be used which extends toward drive motor 220 from surface 280. If the dual pick-up pin configuration is employed, the pins are separated by at least 120°. Each of the pick-up pin 268 (268A) and drive pin 258 are located away from the major M and minor N axes by more than an angle subtended at the axle 132 by the width of the respective drive and/or pick-up pin to allow for consecutive locations along the profile of beam 10 to have the same blocking position. In other words, this allows two adjacent profile wheels to be in the same position relative to the beam.

As the first profile wheel $131_1$ is rotated, its associated drive pin 258 engages adjacent profile wheel $131_2$ forcing it to rotate about axle 132. The drive pin associated with profile wheel $131_2$ engages adjacent profile wheel $131_3$ forcing it to rotate. This process continues until all of the profile wheels are engaged by rotation of the drive wheel 210.

Returning to FIG. 4, once the last profile wheel $131_N$ is in the desired position with respect to blocking a portion of ribbon beam 10 corresponding to the location of the profile wheel $131_N$ as confirmed by the profiler described below with reference to FIG. 7, the drive wheel 210 stops and rotates in the opposite direction where pick-up pin 168 engages an adjacent profile wheel. For example, drive wheel 210 is rotated clockwise until each of the profile wheels $131_1 \ldots 131_N$ are engaged by the respective drive pins 258 and likewise forced to rotate in a clockwise direction. When profile wheel $131_N$ which is farthest from drive motor 220 is in the desired position with respect to its location along ribbon beam 10, drive wheel 210 stops rotating in the clockwise direction. Drive wheel 210 then rotates in the opposite, in this case counterclockwise direction, again engaging each profile wheel $131_{N-1} \ldots 131_1$ via respective pick up pins 268 of each profile wheel except for profile wheel $131_N$ which remains in the desired position. This counterclockwise rotation continues until each of the remaining profile wheels $131_1 \ldots 131_{N-1}$ is in the desired position to block a portion of the ribbon beam 10 to obtain the desired beam profile uniformity. Rotation of the profile wheels may be done at relatively high speeds. The average number of rotations (clockwise and counterclockwise) of drive wheel 210 needed to engage and set each of the profile wheels $131_1 \ldots 131_N$ corresponds to ½N(N+2) where N is the number of profile wheels along array 130. Thus, for an array having N=10 profile wheels, the number of turns of drive wheel 210 is approximately 60 (½(10)(10+2)).

Rotation of the profile wheels can generate unwanted heat within the vacuum environment and can be cooled through axle 132. In one embodiment, axle 132 may be defined by a pair or concentric tubes having an inner portion and an outer portion. A coolant (e.g. water) may be pumped into the outer portion of the tube and returned via the inner portion of the tube.

Once the profile wheels $131_1 \ldots 131_N$ are in the desired position with respect to a location along beam 10, drive wheel 210 stops and the profile wheels $131_1 \ldots 131_N$ do not rotate freely about axis 132. Each of the profile wheels $131_1 \ldots 131_N$ is affixed to axle 132 by adjusting the slip torque. Although the slip torque of each of the profile wheels $131_1 \ldots 131_N$ is sufficient to prevent the wheels from rotating once a respective position has been obtained, the slip torque must be low enough to allow drive motor 220 to rotate all of the profile wheels $131_1 \ldots 131_N$ simultaneously. For example, a slip torque of approximately a few oz-inches is adequate for the beam blocking array shown in FIGS. 2A and 2B.

Figure 6:
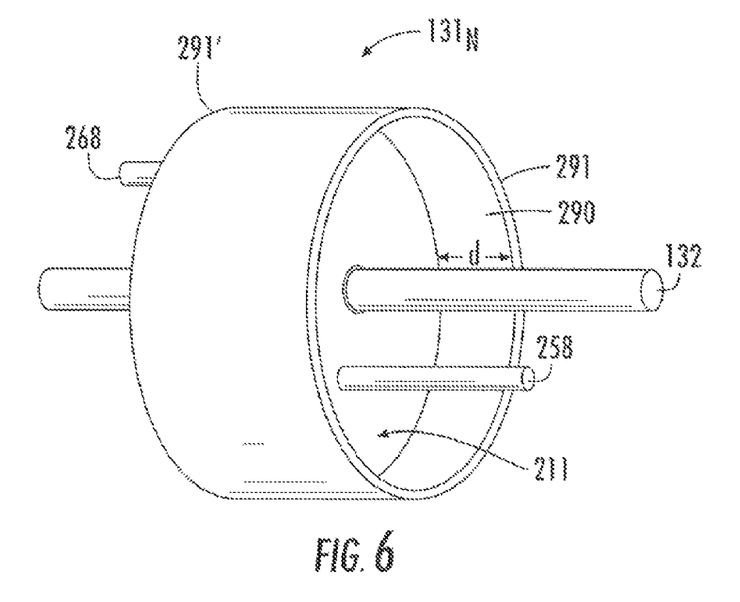
FIG. 6 is a perspective view of alternative configuration of any one of the profile wheels in accordance with the present disclosure.

FIG. 6 is a perspective view of an alternative configuration of any one of the profile wheels $131_1 \ldots 131_N$ shown in FIG. 5 having a collar portion 290 and recessed opposed first and second internal wall surfaces 211. The interior wall surfaces 211 are recessed from the respective perimeters 291, 291' a distance "d" corresponding to collar portion 290. Drive pin 250 extends transversely away from drive motor 220 towards an adjacent profile wheel $131_N$ to engage the adjacent profile wheel. However, the profile wheels $131_1 \ldots 131_N$ shown in FIG. 5 require spacing therebetween along axle 132 since the opposed surfaces 280 and 281 are not recessed from the respective perimeters a distance "d" as shown in FIG. 6. This spacing is required between the profile wheels to allow the pins 258, 268 to rotate and engage an adjacent profile wheel. Thus, an array 130 having profile wheels of FIG. 5 would be configured for placement upstream from a target wafer disposed on platen 114 where the angular spread of the beam 10 means that the blocking profiles at the target wafer generated by the upstream profile wheels will overlap. Thus, the gaps between the profile wheels caused by the pins 258, 268 would not affect the profile. However, if an array 130 including a plurality of profile wheels having the configuration shown in FIG. 5 was located close to the target wafer, the blocking profiles would not overlap. The profile wheel configuration of FIG. 6 avoids this by having the respective drive pin 258 and pickup pin 268 recessed a distance "d" within the collar 290. In this manner, adjacent profile wheels $131_1 \ldots 131_N$ may be positioned more closely since the respective drive pins 258 and pick-up pins 268 are recessed at least partially within collar portions 290 the distance "d" allowing the profile wheels to rotate. Thus, the profile wheel of FIG. 6 is used when the array 130 is disposed downstream along the beam line closer to the target wafer where unwanted spacing between the profile wheels may compromise the desired uniformity profile.

Figure 7:
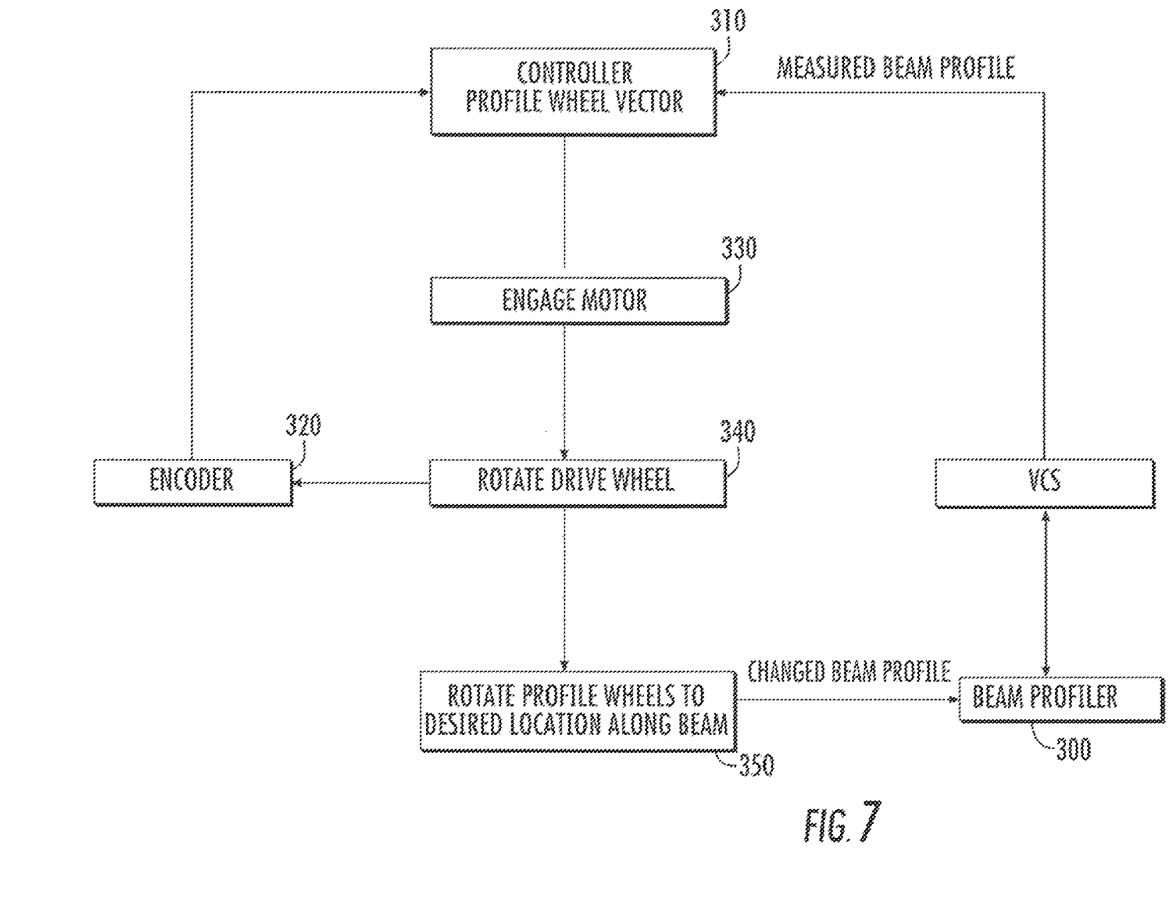
FIG. 7 illustrates an operational flow chart of an exemplary method of configuring the uniformity of an ion beam in accordance with the present disclosure.

FIG. 7 illustrates an operational flow chart of an exemplary method of configuring the uniformity of an ion beam incident on a target wafer or substrate utilizing the beam blocking array 130 in an ion implanter in accordance with this disclosure. A beam profiler is used to measure the profile of an ion beam 10 at step 300. Typically, a beam profiler measures beam current in incremental areas over the cross-sectional area of the ion beam 10 to obtain a beam profile in the form of a two-dimensional map of beam current density. The two-dimensional map may be configured as an X-Y array of pixels, each of which contains a measured value of beam current density in an incremental area of the beam cross section. The two-dimensional map of beam current density is utilized to confirm that the ion beam profile is within specification. If the beam profile is not within specification, the beam blocking array 130 is used to block particular locations of the beam 10 to obtained the desired profile. In particular, the beam profile measured by the profiler at step 300 is supplied to a controller at step 310. The controller compares the measured beam profile with the position of the drive wheel obtained from the encoder 240 at step 320. Based on this comparison, the controller calculates the current density of the profile to be reduced across the ion beam 10. Drive motor 220 is engaged at step 330 which rotates drive wheel 210 at step 340. Drive wheel 210 in turn rotates the profile wheels $131_1 \ldots 131_N$ such that a portion of the ion beam is blocked at a location corresponding to a respective one of the profile wheels $131_1 \ldots 131_N$ at step 350. In particular, drive wheel 210 rotates profile wheels $131_1 \ldots 131_N$ in a first direction until the last profile wheel $131_N$ which is the furthest away from the drive motor 220 is in the desired location with respect to the ion beam. The remaining profile wheels $131_1 \ldots 131_{N-1}$ are rotated in a second direction opposite the first direction until all the profile wheels have been set corresponding to a respective location of the ion beam to block that portion of the beam. The amount or degree to which each profile wheel blocks the ion beam changes as the wheels rotate about axle 132. Again, the beam profiler measures the beam profile at step 300 and the process continues until the desired beam profile is obtained. In this manner, a desired profile of an ion ribbon beam is obtained by positioning a beam blocking array along the path of an beam and mechanically blocking portions of the beam to varying degrees across the width of the beam.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A beam blocking array positioned along a path of an ion ribbon beam in an ion implanter, said ion ribbon beam having beam profile, said beam blocking array comprising:
    a drive motor;
    a drive wheel rotated by said drive motor; and
    a plurality of profile wheels disposed along an axle connected to said drive wheel, at least one of said plurality of profile wheels configured to rotate when said drive wheel rotates, each of said profile wheels disposed across a width of said ribbon beam and having a position corresponding to a location of said beam.

2. The beam blocking array of claim 1 wherein each of said profile wheels having a first position configured to block at least a portion of said ion beam at a respective beam profile location and a second position configured to allow said beam to pass along said beam path.

3. The beam blocking array of claim 1 wherein each of said profile wheels has an elliptical shape defined by a first and second parallel surfaces.

4. The beam blocking array of claim 3 wherein each of said profile wheels has a drive pin extending substantially perpendicular from said first surface away from said drive motor and substantially parallel to and spaced from said axle.

5. The beam blocking array of claim 3 wherein each of said profile wheels has a pick-up pin extending substantially perpendicular from said second surface toward said drive motor and substantially parallel to and spaced from said axle.

6. The beam blocking array of claim 1 wherein each of said plurality of profile wheels has a first and second perimeter and a first interior wall surface spaced a distance from said first perimeter and a second interior wall surface spaced a distance from said second perimeter.

7. The beam blocking array of claim 6 wherein each of said profile wheels has a drive pin extending substantially perpendicular from said first surface away from said drive motor and substantially parallel to and spaced from said axle.

8. The beam blocking array of claim 6 wherein each of said profile wheels has a pick-up pin extending substantially perpendicular from said second surface toward said drive motor and substantially parallel to and spaced from said axle.

9. The beam blocking array of claim 4 further comprising a drive wheel disposed on said axle and between said drive motor and a first of said plurality of profile wheels, said drive wheel configured to rotate about said axle and force rotation of said plurality of profile wheels.

10. The beam blocking array of claim 9 wherein said drive wheel is defined by a first and second parallel surfaces, said drive wheel further comprising a drive pin extending substantially perpendicular from said first surface away from said drive motor toward said plurality of profile wheels and substantially parallel to and spaced from said axle.

11. The beam blocking array of claim 1 wherein said plurality of profile wheels are spaced along said axle.

12. An ion ribbon beam uniformity control system comprising:
    a plurality of profile wheels disposed along a transverse axle, each of said profile wheels configured to rotate when said axle rotates, each of said profile wheels disposed across a width of said ion ribbon beam and having a position corresponding to a location of said beam profile; and
    a single drive motor configured to rotate each of said plurality of profile wheels at an angle with respect to said ion ribbon beam.

13. The ion ribbon beam uniformity control system of claim 10 further comprising an encoder disposed between said single drive motor and said plurality of profile wheels, said encoder configured to provide position information for each of said plurality of profile wheels.

14. The ion ribbon beam uniformity control system of claim 10 wherein each of said profile wheels has an elliptical shape defined by a first and second parallel surfaces.

15. The ion ribbon beam uniformity control system of claim 12 wherein each of said profile wheels has a drive pin extending substantially perpendicular from said first surface away from said drive motor and substantially parallel to and spaced from said axle.

16. The beam blocking array of claim 12 wherein each of said profile wheels has a pick-up pin extending substantially perpendicular from said second surface toward said drive motor and substantially parallel to and spaced from said axle.

17. An ion implanter comprising:
    an ion source chamber configured to generate ions;
    an extraction electrode assembly disposed adjacent to said ion source chamber, said extraction electrode assembly configured to extract said generated ions and forming an ion beam having a beam path;
    a beam blocking array assembly disposed along said ion beam path, said beam blocking array assembly having a plurality of profile wheels configured to block at least a portion of said ion beam corresponding to a location along a width of said beam, said beam blocking array including a drive assembly defined by a single drive motor and an axle along which said profile wheels are disposed and rotate.

18. A method for controlling ion beam uniformity comprising:
    measuring the profile of an ion beam generated by an ion source;
    supplying said measured beam profile to a controller;
    comparing the measured beam profile with the position of a drive wheel obtained;

calculating a degree of the current density of the profile to be reduced across the ion beam profile;

rotating a plurality of profile wheels utilizing a single drive motor; and blocking a portion of the ion beam at one or more locations corresponding to a respective one of the plurality of profile wheels.

* * * * *